US010369968B2

(12) United States Patent
Dietzel et al.

(10) Patent No.: US 10,369,968 B2
(45) Date of Patent: Aug. 6, 2019

(54) CAPACITIVE SENSOR ARRANGEMENT OF A MOTOR VEHICLE (71) Applicant: Brose Fahrzeugteile GmbH & Co. KG, Hallstadt, Hallstadt (DE)

(72) Inventors: Renee Dietzel, Sonnefeld (DE); Stefan Wild, Coburg (DE)

(73) Assignee: Brose Fahrzeugteile GmbH & Co. KG, Hallstadt, Hallstadt (DE)

( * ) Notice: Subject to any disclaimer, the term of this patent is extended or adjusted under 35 U.S.C. 154(b) by 372 days.

(21) Appl. No.: 15/026,123

(22) PCT Filed: Sep. 26, 2014

(86) PCT No.: PCT/EP2014/070600
§ 371 (c)(1),
(2) Date: Mar. 30, 2016

(87) PCT Pub. No.: WO2015/049170
PCT Pub. Date: Apr. 9, 2015

(65) Prior Publication Data
US 2016/0236654 A1 Aug. 18, 2016

(30) Foreign Application Priority Data
Oct. 1, 2013 (DE) .................. 10 2013 110 866

(51) Int. Cl.
*B60R 25/31* (2013.01)
*G01V 3/08* (2006.01)
(Continued)

(52) U.S. Cl.
CPC .......... *B60R 25/31* (2013.01); *B60R 16/0215* (2013.01); *B60R 25/2054* (2013.01);
(Continued)

(58) Field of Classification Search
CPC ............ H03K 17/955; E05Y 2400/852; G01R 27/2605
See application file for complete search history.

(56) References Cited

U.S. PATENT DOCUMENTS 4,216,403 A   8/1980   Krempl et al.
4,723,196 A   2/1988   Hofmeister et al.
(Continued)

FOREIGN PATENT DOCUMENTS

DE   2103768   8/1971
DE   2831939   2/1979
(Continued)

OTHER PUBLICATIONS

"German Search Report," for Priority Application DE102013110866.0, dated Sep. 11, 2014, 8 pages.
(Continued)

*Primary Examiner* — Huy Q Phan
*Assistant Examiner* — Adam S Clarke
(74) *Attorney, Agent, or Firm* — Pauly, DeVries Smith & Deffner LLC (57) ABSTRACT The invention relates to a capacitive sensor arrangement for a motor vehicle, comprising an elongate, flat measuring electrode and at least one fastening element for fastening the measuring electrode on a support component. It is provided that the fastening element has a retaining tongue, which can be elastically deflected out of a rest position, and the uninstalled measuring electrode can be slid, for the fastening thereof, underneath the retaining tongue via a flat side in an installation motion, which elastically deflects the retaining tongue.

18 Claims, 5 Drawing Sheets (51) Int. Cl.
*B60R 25/20* (2013.01)
*B60R 16/02* (2006.01)
*E05F 15/73* (2015.01)

(52) U.S. Cl.
CPC ............... *G01V 3/08* (2013.01); *E05F 15/73* (2015.01); *E05Y 2400/852* (2013.01); *E05Y 2400/858* (2013.01); *E05Y 2900/546* (2013.01); *H03K 2217/96078* (2013.01)

(56) References Cited

U.S. PATENT DOCUMENTS

| | | | |
|---|---|---|---|
| 5,999,411 | A | 12/1999 | Patel et al. |
| 6,337,793 | B1 | 1/2002 | Vier et al. |
| 6,441,623 | B1 | 8/2002 | Moon et al. |
| 6,700,083 | B2 | 3/2004 | Konda et al. |
| 6,879,250 | B2 | 4/2005 | Fayt et al. |
| 8,441,366 | B2 | 5/2013 | Buss |
| 9,028,143 | B2 | 5/2015 | Bard et al. |
| 2001/0023778 | A1* | 9/2001 | Kondoh ............... B60R 16/0215 174/135 |
| 2004/0038123 | A1 | 2/2004 | Hisamitsu et al. |
| 2008/0122456 | A1* | 5/2008 | Moon ................... H03K 17/955 324/674 |
| 2011/0012624 | A1* | 1/2011 | Gastel .................... B60R 19/48 324/686 |
| 2011/0012744 | A1* | 1/2011 | Buss ........................ B60J 5/101 340/686.6 |
| 2012/0108100 | A1 | 5/2012 | Hüppe et al. |
| 2012/0123649 | A1* | 5/2012 | Eggers .................... B60R 13/07 701/49 |
| 2012/0158253 | A1* | 6/2012 | Kroemke ............ B60R 25/2054 701/49 |
| 2012/0160691 | A1 | 6/2012 | Mahabadi et al. |
| 2018/0174716 | A1* | 6/2018 | Kominato ............ H01R 11/288 |

FOREIGN PATENT DOCUMENTS

| | | |
|---|---|---|
| DE | 4113033 | 10/1992 |
| DE | 4338687 | 7/1995 |
| DE | 19804165 | 2/1999 |
| DE | 102004060618 | 7/2006 |
| DE | 60314825 | 3/2008 |
| DE | 102008059661 | 6/2010 |
| DE | 102009017230 | 8/2010 |
| DE | 102010027872 | 10/2011 |
| EP | 2615426 | 7/2013 |
| EP | 2624669 | 8/2013 |
| GB | 1279223 | 6/1972 |
| GB | 1531931 | 11/1978 |
| WO | 2007131372 | 11/2007 |
| WO | 2012059100 | 5/2012 |
| WO | 2012171756 | 12/2012 |

OTHER PUBLICATIONS

International Search Report for priority application DE 10 2013 110 866.0 dated Sep. 11, 2014 (8 pages).
Communication Pursuant to Article 94(3) EPC for co-pending European Patent Application No. 14784012.8, dated May 18, 2017 (5 pages).
Office Action for co-pending Chinese Patent Application No. 201480054270.9, dated Mar. 3, 2017 (9 pages).

* cited by examiner

CAPACITIVE SENSOR ARRANGEMENT OF A MOTOR VEHICLE

CROSS-REFERENCE TO RELATED APPLICATIONS

This application is a national stage application under 35 U.S.C. 371 of Inter-national Patent Application Serial No. PCT/EP2014/070600, entitled "Kapazitive Sensoranordnung eines Kraftfahrzeugs," filed Sep. 26, 2014, which claims priority from German Patent Application No. DE 10 2013 110 866.0, filed Oct. 1, 2013, the disclosures of which are incorporated herein by reference.

FIELD OF THE TECHNOLOGY

The document relates to a capacitive sensor arrangement for a motor vehicle, a sensor module having a support component and such a sensor arrangement, and to a method for installing the measuring electrode of such a sensor arrangement.

BACKGROUND

The capacitive sensor arrangement for a motor vehicle under discussion can be used for highly diverse areas of application. The focus in the present case is on the sensor-supported detection of operating events. An operating event to be detected can be, for example, a person approaching the motor vehicle, a predetermined foot movement of a person, or the like. The sensor-supported detection of such operator events triggers corresponding control reactions, for example, the opening of the hatchback of the motor vehicle by means of a motor.

The known sensor arrangement (DE 10 2010 027 872 A1), from which the invention proceeds, comprises an elongate, flat measuring electrode, which is integrated into the bumper of the motor vehicle. A support component having a plurality of openings is provided in the bumper for the fastening of the measuring electrode. Assigned to each opening is a separate fastening element, which is intended to be connected to the measuring electrode in a first working step. In a second working step, the fastening elements are clipped into the assigned openings in the support component, one after the other.

The known sensor arrangement ensures a mechanically robust fastening of the measuring electrode on the support component. There is potential to optimize the ease of installation of the measuring electrode.

SUMMARY

The problem addressed by the invention is that of designing and refining the known sensor arrangement in such a way that the effort required to install the measuring electrode on a support component is reduced.

The aforementioned problem is solved in the case of a sensor arrangement as described herein.

It is essential that the fundamental consideration is that the fastening element, of which several can be present and can be assigned to the measuring electrode, can be designed in such a way that the fastening of the measuring electrode on the support component is carried out in only one single working step. According to the invention, it has been recognized that this can be implemented by equipping the fastening element with a retaining tongue, which can be elastically deflected out of a rest position.

Specifically, the arrangement is designed according to the invention in such a way that the uninstalled measuring electrode can be slid, for the fastening thereof, underneath the retaining tongue via a flat side in an installation motion, which elastically deflects the retaining tongue. Given a suitable orientation of the potentially multiple fastening elements, it is readily possible for the measuring electrode to be slid underneath the fastening tongues of the fastening elements in a single installation motion, in a single working step.

As a result of the reduction of one working step in the fastening of the measuring electrode on the support component, the ease of installation can be noticeably increased via the solution according to the invention. At the same time, the structural implementation, i.e., equipping the fastening elements with retaining tongues, is relatively low-cost.

The term "measuring electrode" should be broadly interpreted in the present case. It includes all types of electrode arrangements that are elongate and flat. These also include electrode arrangements having multiple individual electrodes, which are combined to form one elongate and flat arrangement. In particular, the term "measuring electrode" includes an electrode in the form of a so-called flat conductor.

In an embodiment, the retaining tongue of the particular fastening element extends transversely with respect to the local longitudinal extension of the measuring electrode. The term "local longitudinal extension" relates to the longitudinal extension of the measuring electrode in the area of the particular fastening element. This wording results from the fact that the measuring electrode can extend longitudinally along any types of contours.

Various embodiments relate to the equipping of the fastening element with a locking element, with which a locking of the measuring element with respect to a movement of the measurement electrode parallel to a flat side of the measuring electrode can be accomplished. Particularly high ease of installation results according to an embodiment in that, in the course of the installation motion, the measuring electronics snaps into locking engagement such that the locking takes place automatically.

A particularly precise positioning of the measuring electrode results from an embodiment. In this case, the elasticity of the retaining tongue, in one variant, causes the measuring electrode to be pressed against a wall element, which can be a component of the particular fastening element or of the support component.

In some embodiments, it is provided, in the sense of a uniform fastening along the longitudinal extension of the measuring electrode, that at least two, in particular several fastening elements are provided. All comments made with respect to a single fastening element apply here for each of these at least two fastening elements.

According to an embodiment, a sensor module having a support component and a sensor arrangement, is provided, wherein the measuring electrode of the sensor arrangement is fastened on the support component by means of the at least one fastening element. The support component can be a body component, a structural component, a module support, or the like. Depending on the application, the at least one fastening element can be fastened on the support component by means of various connection techniques or can be an integral component of the support component. It is advantageous, in particular, to provide such a sensor module, since the entire sensor arrangement, in a preinstalled state, is set up such that an operability test is possible before final installation.

According to an embodiment, a method for installing the measuring electrode of a capacitive sensor arrangement is provided. According to this further teaching, it is essential that at least two fastening elements are provided and the measuring electrode is slid, for the fastening thereof, underneath the retaining tongues of the fastening elements via a flat side in a single, in particular, linear installation motion, which elastically deflects the retaining tongues. As explained above, the installation can be accomplished in a single working step, which therefore increases the ease of installation.

In an embodiment, it is proposed that the measuring electrode is slid, for the fastening thereof, underneath the retaining tongues of at least two fastening elements essentially simultaneously, which elastically deflects the retaining tongues. Therefore, in the best case, the fastening to the individual fastening elements is also completed simultaneously, and so the entire time required for fastening the measuring electrode is correspondingly short.

An embodiment provides a capacitive sensor arrangement for a motor vehicle, comprising an elongate, flat measuring electrode and at least one fastening element for fastening the measuring electrode on a support component, wherein the fastening element has a retaining tongue, which can be elastically deflected out of a rest position, and the uninstalled measuring electrode can be slid, for the fastening thereof, underneath the retaining tongue via a flat side in an installation motion, which elastically deflects the retaining tongue.

In an embodiment, the retaining tongue of the fastening element has a longitudinal extension, and the longitudinal extension of the retaining tongue is oriented essentially transversely to the local longitudinal extension of the measuring electrode, such as the deflection of the retaining tongue is a bending of the retaining tongue about a bend axis, which is oriented essentially transversely to the longitudinal extension of the retaining tongue.

In an embodiment, the installation motion is oriented transversely to the local longitudinal extension of the measuring electrode and parallel to a flat side of the measuring electrode.

In an embodiment, the retaining tongue of the fastening element has at least one installation bevel, which engages with the measuring electrode during the installation motion and thereby induces a deflection of the retaining tongue, such as the installation bevel is disposed on the free end of the retaining tongue.

In an embodiment, a locking element is provided, which is engaged with the installed measuring electrode in an interlocking or force-locked manner for locking the installed measuring electrode with respect to a motion parallel to a flat side of the measuring electrode, such as, with the measuring electrode installed, the locking element plunges into a locking recess in or on the measuring electrode, such as into a locking recess in the flat side of the measuring electrode.

In an embodiment, the measuring electrode enters into locking engagement with the locking element in the course of the installation motion, in particular, driven by the restoring force of the retaining tongue, snaps into locking engagement with the locking element.

In an embodiment, with the measuring electrode installed, the retaining tongue blocks a loosening motion of the measuring electrode out of the locking engagement with the locking element, such that the loosening motion of the measuring electrode can be released via an elastic deflection of the retaining tongue.

In an embodiment, the locking element is disposed on the retaining tongue of the fastening element, or the locking element is fixedly disposed with respect to the retaining tongue, or the locking element is disposed on the measuring electrode.

In an embodiment, the measuring electrode can be locked, by means of the locking element, exclusively in a direction transversely to the local longitudinal extension of the measuring electrode, such that the locking element is disposed on the free end of the retaining tongue, further the locking element can be designed as part of a longitudinal guide for the measuring electrode in the direction of the local longitudinal extension of the measuring electrode.

In an embodiment, the locking element provides an installation bevel of the retaining tongue, and/or the locking element has a hook-like form such that a motion of the installed measuring electrode opposite the installation motion generates a force onto the retaining tongue in the direction of the rest position.

In an embodiment, when the measuring electrode is installed, the retaining tongue of the fastening element is at least slightly elastically deflected and the elastic restoring force acts on the measuring electrode, in particular essentially transversely to a flat side of the measuring electrode, such that when the measuring electrode is installed, the retaining tongue presses, via its restoring force, the measuring electrode against a wall element, such as against a wall element of the fastening element or of the support component.

In an embodiment, the fastening element has a retaining frame, within which the retaining tongue is disposed, such that the retaining frame can be integral with the retaining tongue, further the retaining frame can be manufactured together with the retaining tongue via plastic injection-molding.

In an embodiment, at least two, in particular multiple fastening elements are provided, which are disposed along the measuring electrode.

In an embodiment, the measuring electrode, along its longitudinal extension, has multiple locking recesses, each of which is assigned to a locking element of a fastening element.

An embodiment provides a sensor module comprising a support component and a capacitive sensor arrangement as described herein, wherein the measuring electrode of the sensor arrangement is fastened on the support component via the at least one fastening element.

In an embodiment, the fastening element is connected to the support component as a single piece, such that the fastening element can be connected to a wall element of the support component as a single piece, such that the fastening element extends essentially parallel to the wall plane of the wall element.

An embodiment provides a method for installing the measuring electrode of a capacitive sensor arrangement as described herein, wherein at least two fastening elements are provided, and wherein the measuring electrode is slid, for the fastening thereof, underneath the retaining tongues of the fastening elements via a flat side in a single, in particular linear installation motion, which elastically deflects the retaining tongues.

In an embodiment, the measuring electrode is slid, for the fastening thereof, underneath the retaining tongues of at least two fastening elements essentially simultaneously, which elastically deflects the retaining tongues.

BRIEF DESCRIPTION OF THE FIGURES

The invention is explained in greater detail in the following with reference to only one drawing, which illustrates an exemplary embodiment. In the drawing.

DETAILED DESCRIPTION

The capacitive sensor arrangement 1 according to the invention can be used in diverse areas of application in a motor vehicle. Depending on the design, it enables the sensor detection of the presence and/or movement of an object. The sensor detection is based on a change in capacitance of the measuring electrode 2 with respect to mass or with respect to a further measuring electrode 2, which can be easily electronically detected. In this case, the sensor arrangement 1 is used for detecting an operating event, specifically a predetermined foot movement of a person, wherein the sensor detection of the operating event triggers an opening of the hatchback 3 of the motor vehicle by means of a motor. Another exemplary area of application is collision detection in motor vehicle hatchbacks.

Figure 1:
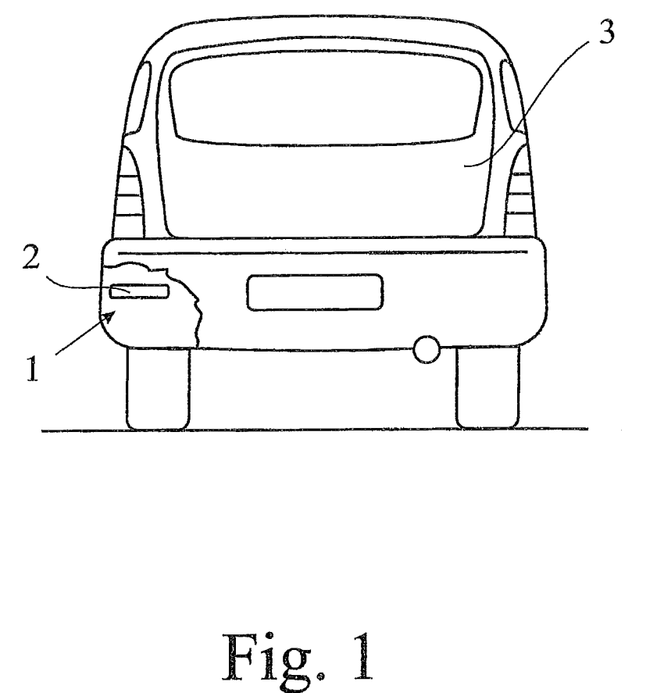
FIG. 1 shows a rear view of a motor vehicle having a capacitive sensor arrangement according to the invention.
Figure 2:
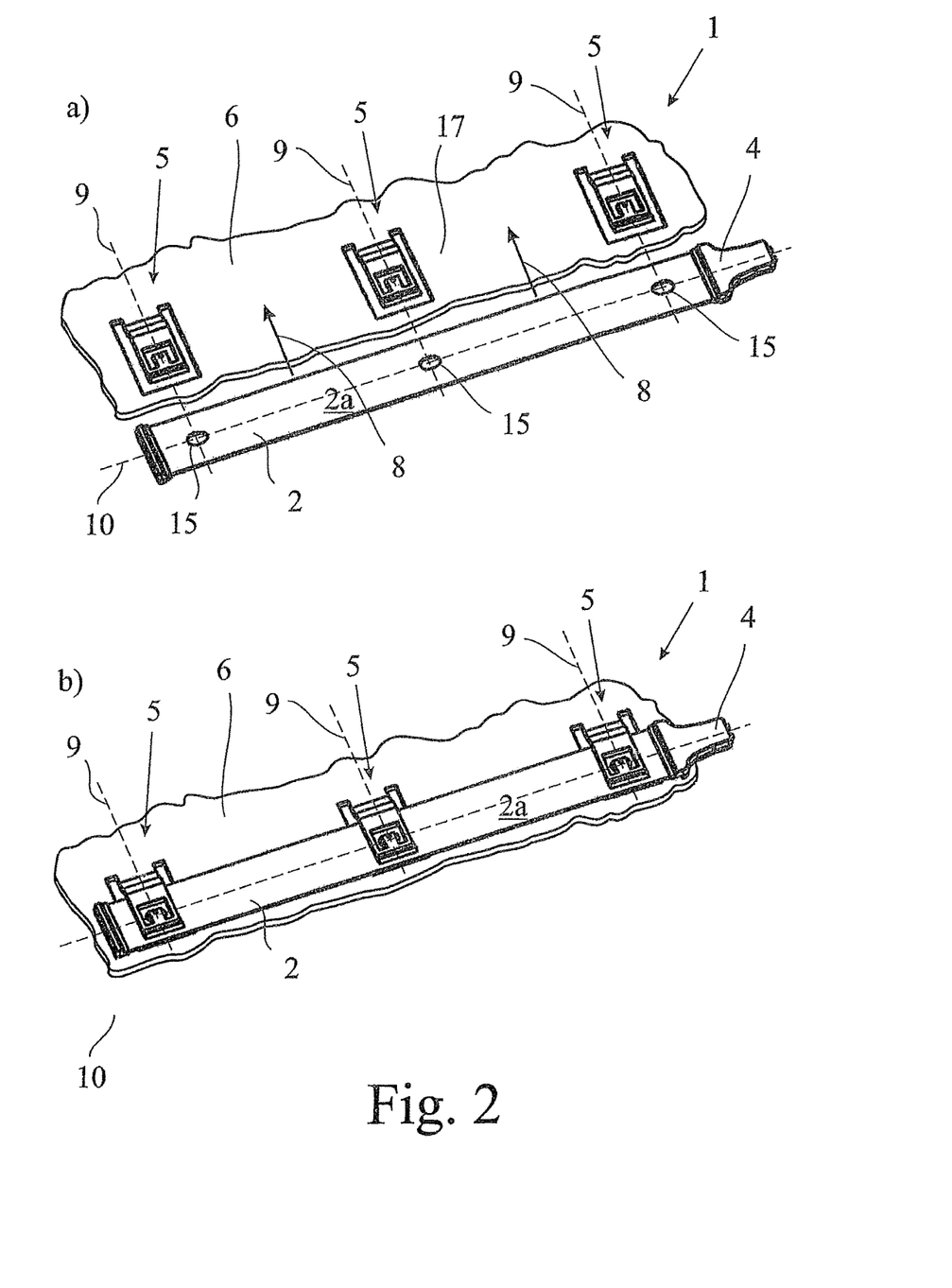
FIG. 2 shows a perspective view of the sensor arrangement according to FIG. 1, a) with the measuring electrode uninstalled and b) with the measuring electrode installed.

Viewing FIG. 1 and FIG. 2 in combination shows that the capacitive sensor arrangement 1 is equipped with an elongate, flat measuring electrode 2. The measuring electrode 2 therefore has two opposite flat sides 2a, which are oriented parallel to one another, and two opposite narrow sides 2b. The measuring electrode 2 can be a flat conductor, which is encased in an insulation in a routine manner. The measuring electrode 2 also has a connector 4 for electrical contacting, which is illustrated in FIG. 2.

FIG. 2 further shows that the measuring electrode 2 comprises at least one fastening element 5 for fastening the measuring electrode 2 on a support component 6. In an embodiment, at least two fastening elements 5 are provided. In the exemplary embodiment shown, multiple fastening elements 5, specifically a total of three fastening elements 5, of the measuring electrode 2 are provided on the support component 6. The part of the sensor arrangement 1 comprising the measuring electrode 2 can therefore be fastened on the support component 6.

Figure 3:
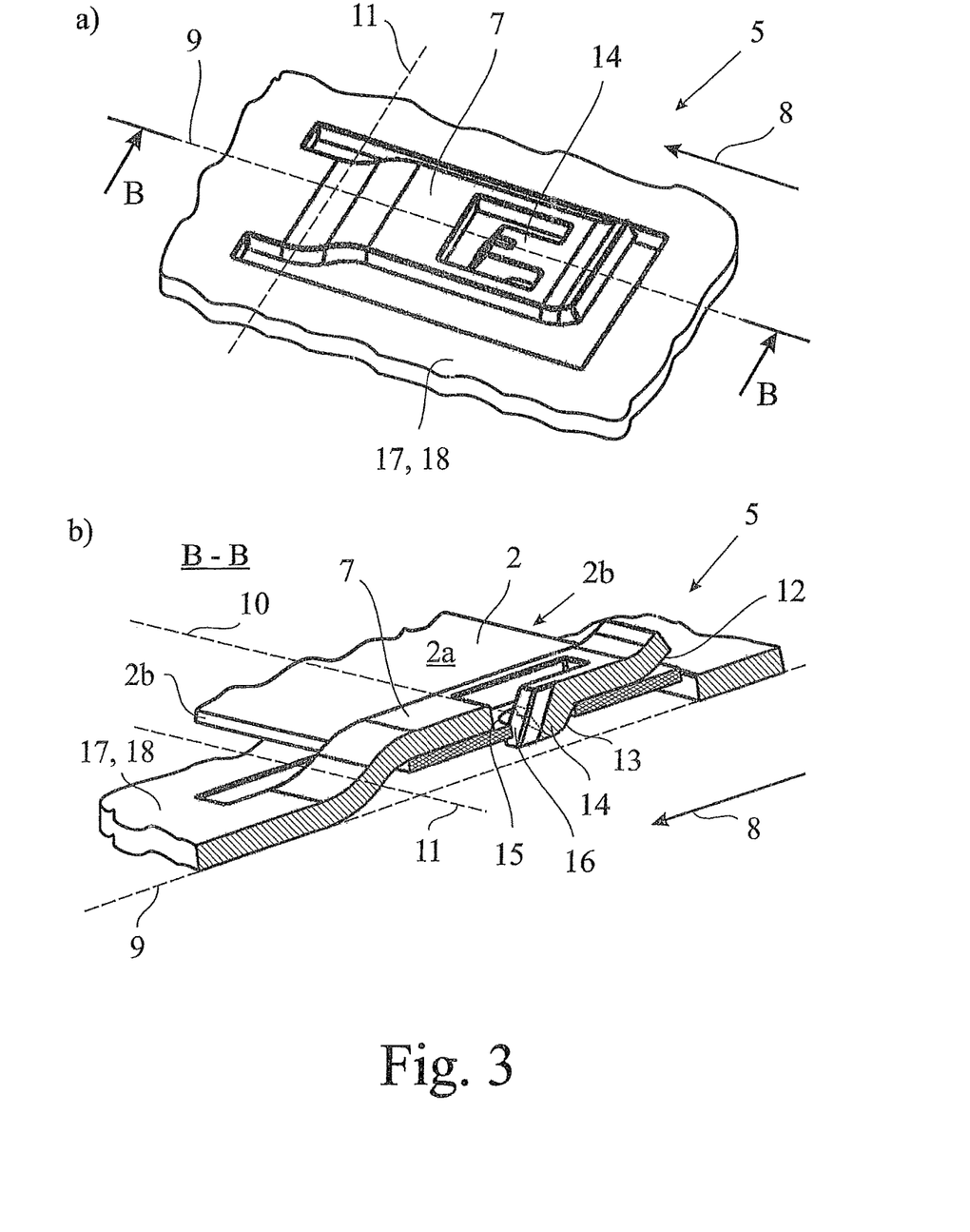
FIG. 3 shows a fastening element of the sensor arrangement according to FIG. 2, a) in a perspective view without a measuring electrode and b) in a perspective sectional view along the line of cut B-B with the measuring electrode installed.
Figure 4:
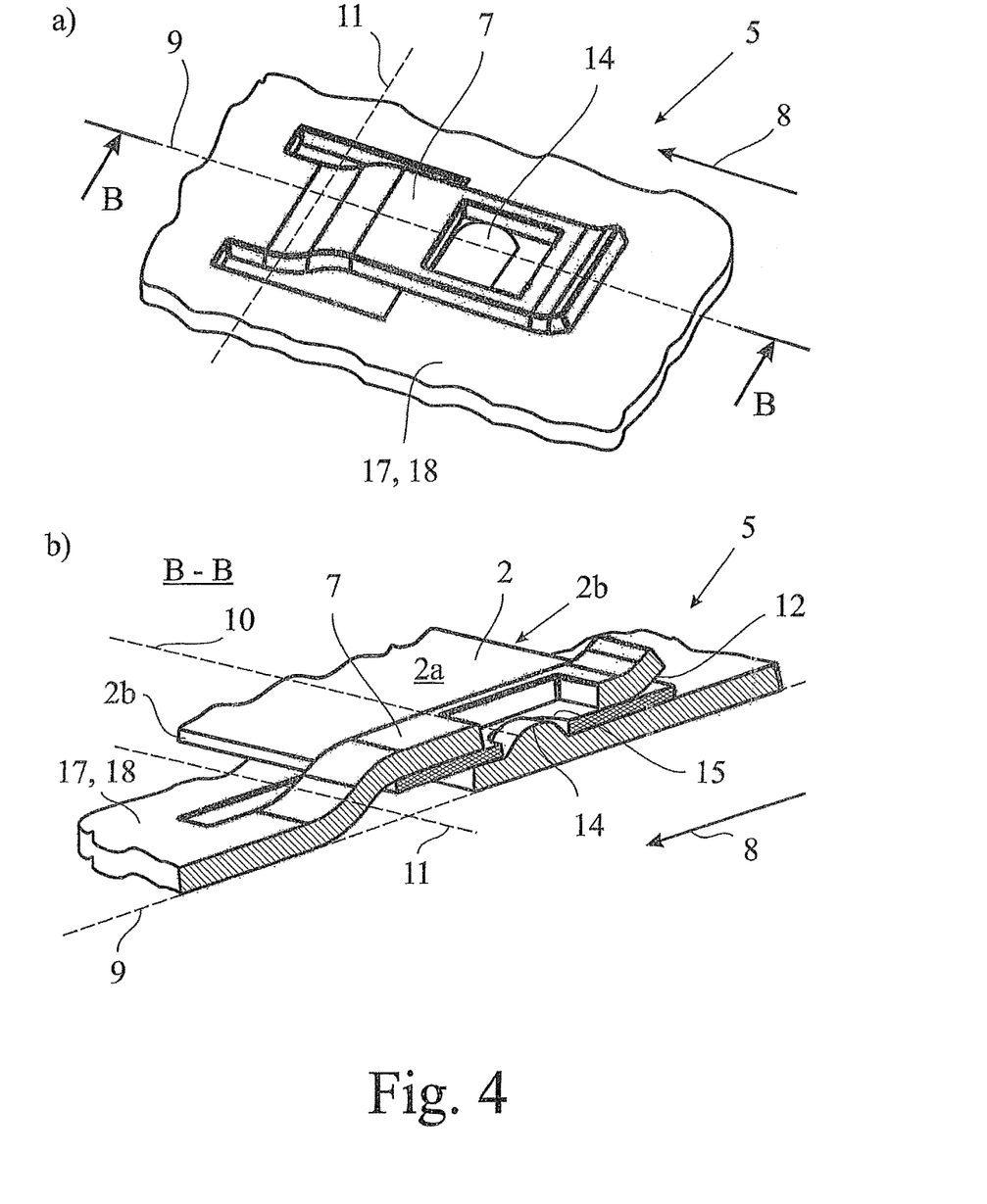
FIG. 4 shows a second embodiment of a fastening element of the sensor arrangement according to FIG. 2, in the views according to FIG. 3.
Figure 5:
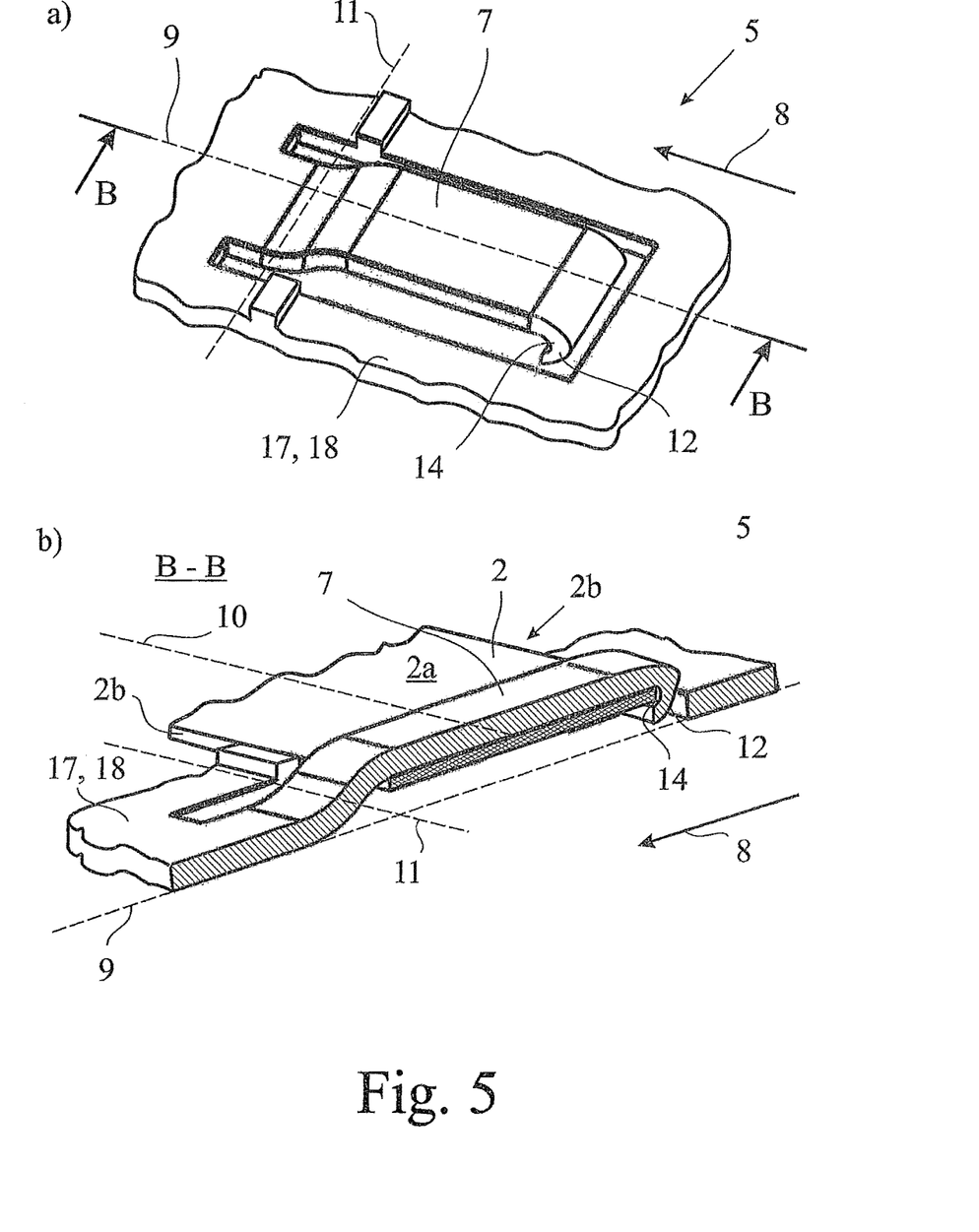
FIG. 5 shows a third embodiment of a fastening element of the sensor arrangement according to FIG. 2, in the views according to FIG. 3.

FIGS. 3 through 5 each show different embodiments of an example of the fastening elements 5. In the exemplary embodiments illustrated, each of the fastening elements 5 is an integral component of the support component 6. In principle, the fastening elements 5 can also be present as separate components, however, which can be connected to the support component 6, which is explained further below.

In the interest of clarity, only a single fastening element 5 will be discussed, nearly exclusively, in the following. All comments made in this regard apply similarly to all remaining fastening elements 5.

The structural design of the fastening element 5 has highly particular significance in the present case. It is essential that the fastening element 5 comprises a retaining tongue 7, which can be elastically deflected out of a rest position illustrated in FIG. 3a. In FIG. 3a, this deflection refers to an upward deflection of the retaining tongue 7. The uninstalled measuring electrode 2 shown in FIG. 2a can therefore be slid, for the fastening thereof, underneath the retaining tongue 7 via a flat side 2a in an installation motion 8, which elastically deflects the retaining tongue 7.

The elastic deflection of the retaining tongue 7 within the scope of the installation motion 8 can be utilized in different ways, depending on the application. One possibility is to implement a snap-fit locking of the measuring electrode 2. Another possibility is to utilize the elastic restoring force of the retaining tongue 7 for pressing on the measuring electrode 2. This is explained in greater detail further below.

The retaining tongue 7 of the fastening element 5 has a longitudinal extension 9, wherein the longitudinal extension 9 of the retaining tongue 7 is oriented essentially transversely to the local longitudinal extension 10 of the measuring electrode 10. It was noted above that "local longitudinal extension" means the longitudinal extension that the measuring electrode 2 has in the area of the particular fastening element 5. It is conceivable that the measuring electrode 2 extends longitudinally along any type of contour, as was described above.

In this case, the deflectability of the retaining tongue 7 is implemented via a flexibility of the retaining tongue 7. Therefore, in this case, the retaining tongue 7 consists of an elastic, flexible material, at least in a flexible region, and in some embodiments entirely. In this case, the deflection of the retaining tongue 7 can be a bending of the retaining tongue 7 about a bend axis 11, which is essentially oriented transversely to the longitudinal extension 9 of the retaining tongue 7.

The arrangement is now designed in such a way that the installation motion 8 is oriented transversely to the local longitudinal extension of the measuring electrode 2 and parallel to a flat side 2a of the measuring electrode 2. The installation motion 8 illustrated in FIG. 2 is an installation motion 8, which is linear overall; this simplifies the installation of the measuring electrode 2. Even an automated, in particular robot-supported installation, which does not require complex handling devices, is conceivable.

In the case of the fastening element 5 according to the invention, the fact that the elastic deflection of the retaining tongue 7 is associated with the installation motion 8 is interesting. For this purpose, the retaining tongue 7 can be equipped with at least one installation bevel 12, 13, which engages with the measuring electrode 2 during the installation motion 8 and thereby effectuates a deflection of the retaining tongue 7. A first installation bevel 12 is disposed on the free end of the retaining tongue 7, which is shown most clearly in the illustration according to FIG. 3b. During the installation motion 8, a narrow side 2b of the measuring electrode 2 first engages with the installation bevel 12 on the free end of the retaining tongue 7, which results in an initial upward deflection of the retaining tongue 7 in FIG. 3b.

The implementation of the installation bevels 12, 13 can be accomplished in a very different structural manner. In this case, the installation bevel 12 disposed on the free end of the retaining tongue 7 is simply shaped in the manner of a bending of the retaining tongue 7. The further installation bevel 13 is explained in greater detail further below.

In various embodiments that are illustrated, the fastening element 5 is equipped with a locking element 14, which is interlockingly engaged with the installed measuring electrode 2 for locking the installed measuring electrode 2 with respect to a motion parallel to a flat side 2a of the measuring electrode 2. In principle, it is also conceivable here that a force-locked, in particular, clamping engagement between the locking element 14 and the measuring electrode 2 is effectuated. In principle, it is further conceivable that the locking element 14 is assigned to the measuring electrode 2 or to a further component, as will be explained.

The particular sectional illustrations in FIGS. 3 and 4 show that, here with the measuring electrode 2 installed, the locking element 14 plunges into a locking recess 15 in or on the measuring electrode 2, in particular into a locking recess 15 in the flat side 2a of the measuring electrode 2. In this case, in addition, the locking recess 15 is a continuous locking hole in the measuring electrode 2.

The locking recesses 15 in the measuring electrode 2, which are shown in FIG. 2a, can be designed in the manner of slots. The longitudinal extension of the slots can be oriented, in this case, along the longitudinal extension 10 of the measuring electrode 2. It is therefore possible to easily compensate for any production tolerances, for example, on the support component 6 or the like. Depending on the design of the locking recesses 15, the position of the measuring electrode 2 can also be readjusted, at least slightly, along its longitudinal extension 10.

In an embodiment according to FIG. 5, the measuring electrode 2 is not necessarily equipped with locking recesses 15. The hook-shaped locking element 14 merely engages with a narrow side 2b of the measuring electrode 2, as will be explained.

In all the embodiments shown, the measuring electrode 2 enters into locking engagement with the locking element 14 in the course of the installation motion 8. This is driven, here in each case by the restoring force of the retaining tongue 7, and so the measuring electrode 2 snaps into the locking engagement with the locking element 14 in the course of the installation motion 8.

When the measuring electrode 2 is installed, a loosening motion of the measuring electrode 2 out of a locking engagement is blocked by the locking element 14. This is shown in the particular sectional illustrations from FIGS. 3-5. The restoring force of the retaining tongue 7 ensures that the blocking of a loosening motion of the measuring electrode 2 is mechanically sufficiently stable such that a secure fastening of the measuring electrode 2 results. However, in all the embodiments, which are illustrated, the blocking of the loosening motion can be eliminated in that the retaining tongue 7 is elastically deflected. By means of an upward deflection of the retaining tongue 7 in FIGS. 3-5, the loosening motion of the measuring electrode 2 can be easily released. This can be necessary, for example, within the scope of a replacement of the measuring electrode 2 for maintenance purposes.

In the embodiments illustrated in FIGS. 3 and 5, the locking element 14 is a component of the fastening element 5 and is disposed on the retaining tongue 7 of the fastening element 5 in each case. Therefore, the locking element 14 follows every deflection of the retaining tongue 7.

In the exemplary embodiment illustrated in FIG. 4, however, the locking element 14 is fixedly arranged with respect to the retaining tongue 7. The locking is effectuated in that the measuring electrode 2 is held in locking engagement with the fixed locking element by means of the retaining tongue 7. In the embodiments illustrated in FIGS. 3-5, however, the locking element 14 itself is held in a corresponding locking engagement with the measuring electrode 2 by means of the retaining tongue 7.

It can also be advantageous, however, for the locking element to be disposed on the measuring electrode 2, in particular being a component of the measuring electrode 2. In this case, the fastening element 5, in some embodiments the retaining tongue 7, is equipped with a locking recess or the like, so that the locking element and the locking recess for locking the installed measuring electrode 2 with respect to a motion parallel to a flat side 2a of the measuring electrode 2 are interlockingly engaged with one another.

An interesting aspect with respect to the design of the locking element 14 is found in the illustration according to FIG. 3. In this case, it is provided that the locking element 14 is elastically deflectable with respect to the retaining tongue 7, i.e., is bendable in this case, wherein the bend axis of the locking element 14 with respect to the retaining tongue 7 is oriented essentially parallel to the bend axis 11 of the retaining tongue 7 itself. This additional elasticity is advantageous, in particular, when the locking engagement is intended to take place in a snap-fitting manner, as discussed above.

It was already noted that locking recesses 15 in the measuring electrode 2 are not required in the embodiment of the fastening element 5 illustrated in FIG. 5. In this embodiment, the lockability of the measuring electrode 2 by means of the locking element 14 is provided exclusively in a direction transverse to the local longitudinal extension 10 of the measuring electrode 2. The fact that an aforementioned readjustment of the position of the measuring electrode 2 along its longitudinal extension 10 is readily possible, is advantageous. A particularly simple structural implementation thereof results in that the locking element 14 is disposed on the free end of the retaining tongue 7 and is hook-shaped as viewed in the longitudinal section of the retaining tongue 7. Very generally, the locking element 14 in this case provides a portion of a longitudinal guidance for the measuring electrode 2 in the direction of the local longitudinal extension 10 of the measuring electrode 2.

In the embodiments that are illustrated in FIGS. 3 and 5, the locking element 14 provides an aforementioned installation bevel 13 of the retaining tongue 7, with which a narrow side of the measuring electrode 2 engages during the installation motion 8, which deflects the retaining tongue 7. Alternatively or additionally, the locking element 14 can have a hook-like form 16 such that a motion of the installed measuring electrode 2 against the installation direction generates a force on the retaining tongue 7 in the direction of the rest position, and therefore generates a clamping. Such a hook-like form 16, in the case of the retaining tongue 7 shown in FIG. 3b, is shown on a side of the locking element 14 that is disposed opposite the installation bevel 13 there.

Alternatively to the aforementioned, hook-like form 16, a start-up bevel can be provided on the locking element 14, which is illustrated in FIG. 3b using a dashed line. With such a start-up bevel, it is possible that a motion of the measuring electrode 2 against the installation motion 8 results in the retaining tongue 7 being lifted out and, therefore, results in the release of the loosening motion of the measuring electrode 2. Given a suitable design, such a release of the loosening motion of the measuring electrode 2 is possible only when a predetermined minimum force is applied onto the measuring electrode 2.

It was already mentioned that the restoring force of the retaining tongue 7 can be used for snapping the locking element 14 into locking engagement with the measuring electrode 2 and for blocking a loosening motion of the measuring electrode 2. In some embodiments, the pressing onto the measuring electrode 2 is provided in addition to the restoring force. Specifically, it is possible that, with the measuring electrode 2 installed, the retaining tongue 7 of the fastening element 5 can be at least slightly elastically deflected, wherein the elastic restoring force acts upon the measuring electrode 2. In this case, the restoring force acts essentially transversely to a flat side 2a of the measuring electrode 2. In order to provide for a fastening of the measuring electrode 2 that is as positionally accurate as possible, with the measuring electrode 2 installed, the retaining tongue 7 can press, via its restoring force, the measuring electrode 2 against a wall element 17, here against a wall element 17 of the fastening element 5 or of the support component 6.

The structural design of the fastening element 5 has highly particular significance in the present case. The fastening element 5 can have a retaining frame 18, within which the retaining tongue 7 is disposed. In this case, the retaining frame 18 is an integral component of the support component 6. As is apparent in the illustrations according to FIGS. 3-5, the retaining frame 18 is integral with the retaining tongue 7. In this case, the retaining frame 18 provides support with respect to the restoring force of the retaining tongue 7.

The embodiment of the fastening element 5 having a retaining tongue 7 and a retaining frame 18 is particularly advantageous for the design of the fastening element 5 as a separate component, which is intended to be connected to the support component 6. As a result, it is therefore easily achieved that the flow of force resulting from the elastic restoring force extends in a closed manner through the fastening element 5 and the measuring electrode 2, specifically through the retaining tongue 7, the measuring electrode 2, and the retaining frame 18. This is advantageous, since the connection of the fastening element 5 to the support component 6 is not loaded by the elastic restoring force of the retaining tongue 7.

As discussed above, the retaining frame 18 is integral with the retaining tongue 7, which can be particularly easily implemented in terms of process engineering in that the retaining frame 18 is produced together with the retaining tongue 7 via plastic injection-molding.

In an embodiment, the fastening element 5 is designed in such a way that it can be manufactured by means of an open/close tool without a sucker pin via plastic injection-molding.

The connection of the fastening element 5 to the support component 6 is possible in highly diverse manners. In an embodiment, the fastening element 5 can be bonded, welded, or clipped onto the support component 6. It is also conceivable, as discussed above, for the fastening element 5 to be an integral component of the support component 6. In particular, the fastening element 5 can be manufactured together with the support component 6 via plastic injection-molding.

In principle, it is also conceivable that the measuring electrode 2 is assigned only a single fastening element 5. In this case, however, at least two, in particular multiple fastening elements 5 are provided, which are disposed along the measuring electrode 2. In the embodiments according to FIGS. 3 and 4, the measuring electrode 2 is therefore equipped, along its longitudinal extension 10, with multiple locking recesses 15, each of which is assigned to a locking element 14 of a fastening element 5.

According to a further teaching, a sensor module having a support component 6 and an aforementioned capacitive sensor arrangement 1 is provided. In this case, the fact that the measuring electrode 2 of the sensor arrangement 1 is fastened on the support component 6 via the at least one fastening element 5 is essential. Reference is made to all comments made with respect to the capacitive sensor arrangement 1 according to the invention.

As explained above, the support component 6 can be a body component, in particular a bumper or a rear apron, a hatchback, or the like. It is also conceivable that the support component 6 is a structural component such as a door frame or the like. It can also be advantageous for the support component 6 to be a module support, which, together with further functional units, if necessary, is finally installed in an installation step downstream from the assembly of the sensor module.

In an embodiment, the fastening element 5 is connected to the support component 6 as a single piece, as illustrated in FIG. 2. In this case, the fastening element 5 is connected to a wall element 17 of the support component 6 as a single piece, wherein, the fastening element 5 can extend essentially parallel to the wall plane of the wall element 17.

According to a further teaching, a method for installing the measuring electrode 2 of a capacitive sensor arrangement 1 according to the invention is provided. It is essential to the method that at least two fastening elements 5 are provided and the measuring electrode 2 is slid, for the fastening thereof, underneath the retaining tongues 7 of the fastening elements 5 via a flat side 2a in a single installation motion 8, which is linear in this case, and which elastically deflects the retaining tongues 7 in the above-described manner. It was already mentioned that such an installation can be accomplished using a single working step, which increases the ease of installation. The installation can be carried out manually, by means of an installation device, or in an automated manner, in particular by means of a robot.

In an embodiment, the measuring electrode 2 is slid, for the fastening thereof, underneath the retaining tongues 7 of at least two fastening elements 5 essentially simultaneously, which elastically deflects the retaining tongues 7. This simplifies and accelerates the installation process, as was likewise described further above.

The invention claimed is:

1. A capacitive sensor arrangement for a motor vehicle, comprising: an elongate, flat measuring electrode,
   a locking element, and
   at least two fastening elements for fastening the measuring electrode on a support component,
   wherein at least one of the fastening elements has a retaining tongue, which can be elastically deflected out of a rest position, and the uninstalled measuring electrode can be slid, for the fastening thereof, underneath the retaining tongue via a flat side in an installation motion, which elastically deflects the retaining tongue,
   wherein the installation motion is oriented transversely to the local longitudinal extension of the measuring electrode and parallel to a flat side of the measuring electrode,
   wherein the locking element is engaged with the installed measuring electrode in an interlocking or force-locked manner for locking the installed measuring electrode with respect to a motion parallel to a flat side of the measuring electrode, wherein the at least two fastening elements are disposed along the measuring electrode,
wherein the measuring electrode, along its longitudinal extension, has multiple locking recesses, each of which is assigned to a locking element of a fastening element.

2. The sensor arrangement as claimed in claim 1, wherein the retaining tongue of the fastening element has a longitudinal extension, and the longitudinal extension of the retaining tongue is oriented essentially transversely to the local longitudinal extension of the measuring electrode.

3. The sensor arrangement as claimed in claim 1, wherein the retaining tongue of the fastening element has at least one installation bevel, which engages with the measuring electrode during the installation motion and thereby induces a deflection of the retaining tongue.

4. The sensor arrangement as claimed in claim 1, wherein the measuring electrode enters into locking engagement with the locking element in the course of the installation motion snaps into locking engagement with the locking element.

5. The sensor arrangement as claimed in claim 1, wherein, with the measuring electrode installed, the retaining tongue blocks a loosening motion of the measuring electrode out of the locking engagement with the locking element.

6. The sensor arrangement as claimed in claim 1, wherein the locking element is disposed on the retaining tongue of the fastening element, or the locking element is fixedly disposed with respect to the retaining tongue, or the locking element is disposed on the measuring electrode.

7. The sensor arrangement as claimed in claim 1, wherein the measuring electrode can be locked, by means of the locking element, exclusively in a direction transversely to the local longitudinal extension of the measuring electrode.

8. The sensor arrangement as claimed in claim 1 wherein the locking element provides an installation bevel of the retaining tongue, and/or the locking element has a hook-like form such that a motion of the installed measuring electrode opposite the installation motion generates a force onto the retaining tongue in the direction of the rest position.

9. The sensor arrangement as claimed in claim 1, wherein, when the measuring electrode is installed, the retaining tongue of the fastening element is at least slightly elastically deflected and the elastic restoring force acts on the measuring electrode.

10. The sensor arrangement as claimed in claim 1, wherein the fastening element has a retaining frame, within which the retaining tongue is disposed.

11. A sensor module comprising a support component and a capacitive sensor arrangement according to claim 1, wherein the measuring electrode of the sensor arrangement is fastened on the support component via the at least one fastening element.

12. The sensor module as claimed in claim 11, wherein the fastening element is connected to the support component as a single piece.

13. A method for installing the measuring electrode of a capacitive sensor arrangement as claimed in claim 1, wherein at least two fastening elements are provided, and wherein the measuring electrode is slid, for the fastening thereof, underneath the retaining tongues of the fastening elements via a flat side in a single installation motion, which elastically deflects the retaining tongues.

14. The method as claimed in claim 13, wherein the measuring electrode is slid, for the fastening thereof, underneath the retaining tongues of at least two fastening elements essentially simultaneously, which elastically deflects the retaining tongues.

15. The sensor arrangement as claimed in claim 2, wherein the deflection of the retaining tongue is a bending of the retaining tongue about a bend axis, which is oriented essentially transversely to the longitudinal extension of the retaining tongue.

16. The sensor arrangement as claimed in claim 3, wherein the installation bevel is disposed on the free end of the retaining tongue.

17. The sensor module as claimed in claim 12, wherein the fastening element is connected to a wall element of the support component as a single piece.

18. The sensor module as claimed in claim 17, wherein the fastening element extends essentially parallel to a wall plane of the wall element.

* * * * *